United States Patent
Kim et al.

(10) Patent No.: US 12,216,909 B2
(45) Date of Patent: Feb. 4, 2025

(54) MEMORY MODULE AND MEMORY SYSTEM INCLUDING ROW HAMMER COUNTER CHIP AND OPERATING METHOD THEREOF

(71) Applicant: SAMSUNG ELECTRONICS CO., LTD., Suwon-si (KR)

(72) Inventors: Taekwoon Kim, Suwon-si (KR); Youngsoo Sohn, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 130 days.

(21) Appl. No.: 17/992,516

(22) Filed: Nov. 22, 2022

(65) Prior Publication Data

US 2023/0205428 A1 Jun. 29, 2023

(30) Foreign Application Priority Data

Dec. 27, 2021 (KR) .................. 10-2021-0188869

(51) Int. Cl.
*G06F 3/06* (2006.01)

(52) U.S. Cl.
CPC .......... *G06F 3/0616* (2013.01); *G06F 3/0653* (2013.01); *G06F 3/0673* (2013.01)

(58) Field of Classification Search
CPC ..... G06F 3/0616; G06F 3/0653; G06F 3/0673
USPC ........................................ 711/105
See application file for complete search history.

(56) References Cited

U.S. PATENT DOCUMENTS

| | | |
|---|---|---|
| 9,754,684 B2 | 9/2017 | Hu et al. |
| 10,303,545 B1 * | 5/2019 | Meaney ............ H03M 13/1515 |
| 10,606,690 B2 | 3/2020 | Criss |
| 10,802,910 B2 | 10/2020 | Deutsch et al. |
| 11,037,619 B2 | 6/2021 | Kim et al. |
| 11,081,185 B2 | 8/2021 | Chibvongodze et al. |
| 11,120,860 B1 * | 9/2021 | Wieduwilt ............ G11C 11/406 |
| 11,664,063 B2 * | 5/2023 | Lovett ................ G11C 11/4078 |
| | | 365/222 |
| 11,688,451 B2 * | 6/2023 | Zhang ................ G11C 11/4078 |
| | | 365/222 |
| 11,694,738 B2 * | 7/2023 | Morohashi ........ G11C 11/40615 |
| | | 365/222 |

(Continued)

FOREIGN PATENT DOCUMENTS

KR 10-2190683 B1 12/2020

OTHER PUBLICATIONS

EP Communication dated Jul. 10, 2023 issued from the European Patent Office in EP Patent Application No. 22212215.2.

*Primary Examiner* — Christopher B Shin
(74) *Attorney, Agent, or Firm* — Sughrue Mion, PLLC

(57) ABSTRACT

A memory module including a row hammer counter chip, a memory system including the same, and a method of operating the memory system are provided. The memory module includes a plurality of data chips each of which is configured to store a data set corresponding to a plurality of burst lengths, and at least one row hammer counter chip including counter memory cells each of which is connected to a word line, among a plurality of word lines, for each of the plurality of data chips, wherein the at least one row hammer counter chip is configured to store in each of the counter memory cells connected to the word line, a number of times the word line is accessed for each of the plurality of data chips during a row hammer monitoring time frame.

22 Claims, 10 Drawing Sheets

(56) References Cited

U.S. PATENT DOCUMENTS

| | | | |
|---|---|---|---|
| 11,699,476 B2* | 7/2023 | Brown | G11C 11/4087 |
| | | | 365/222 |
| 11,984,148 B2* | 5/2024 | Penney | G11C 11/40611 |
| 2014/0095780 A1 | 4/2014 | Bains et al. | |
| 2014/0122974 A1* | 5/2014 | Yun | G06F 11/1048 |
| | | | 714/773 |
| 2015/0109871 A1* | 4/2015 | Bains | G11C 11/40611 |
| | | | 365/222 |
| 2017/0330860 A1* | 11/2017 | Shim | G11C 5/04 |
| 2018/0152206 A1* | 5/2018 | Sin | H03M 13/2906 |
| 2019/0220349 A1 | 7/2019 | Deutsch et al. | |
| 2020/0177392 A1 | 6/2020 | Durham et al. | |
| 2021/0043248 A1 | 2/2021 | Lee et al. | |
| 2021/0089359 A1* | 3/2021 | Culp | G06F 9/468 |
| 2021/0133028 A1* | 5/2021 | Kim | G06F 11/1048 |
| 2021/0141692 A1 | 5/2021 | Agarwal et al. | |
| 2021/0264999 A1* | 8/2021 | Bains | G11C 7/24 |
| 2021/0365316 A1* | 11/2021 | Nale | G11C 11/40611 |
| 2022/0067157 A1* | 3/2022 | Le Rolland | G06F 3/0622 |
| 2022/0121398 A1* | 4/2022 | Nale | G06F 3/0659 |
| 2023/0040958 A1* | 2/2023 | Lee | G11C 11/4078 |
| 2023/0125774 A1* | 4/2023 | Yen | G11C 11/4087 |
| | | | 365/222 |
| 2023/0161496 A1* | 5/2023 | Jung | G11C 11/4078 |
| | | | 711/154 |
| 2023/0162776 A1* | 5/2023 | Kim | G11C 11/40603 |
| | | | 365/222 |
| 2023/0206988 A1* | 6/2023 | Ayyapureddi | G11C 11/408 |
| | | | 365/185.04 |
| 2024/0079042 A1* | 3/2024 | Ahn | G11C 11/40611 |

* cited by examiner

MEMORY MODULE AND MEMORY SYSTEM INCLUDING ROW HAMMER COUNTER CHIP AND OPERATING METHOD THEREOF

CROSS-REFERENCE TO RELATED APPLICATION

This application is based on and claims priority under 35 U.S.C. § 119 to Korean Patent Application No. 10-2021-0188869, filed on Dec. 27, 2021, in the Korean Intellectual Property Office, the disclosure of which is incorporated by reference herein in its entirety.

BACKGROUND

1. Field

The disclosure relates to memory systems, and more particularly, to memory modules including a row hammer counter chip.

2. Description of Related Art

Memory systems may include various types of memory modules. Memory processing is generally configured to be performed on a single memory so that the performance and characteristics of the memory processing may be determined by the single memory. Application processing that requires a large memory capacity may utilize a high-capacity memory, such as a dual in-line memory module (DIMM). The DIMM may include a plurality of dynamic random access memory (DRAM) chips implemented on a signal substrate. A controller of the memory system may provide Reliability Availability Serviceability (RAS) functions of DRAM chips.

Recently, DRAM cell sizes are decreasing to increase DRAM capacity and density. Some DRAM-based systems sometimes experience intermittent failure due to heavy workload. These failures are sometimes traced to repetitive access to a row of single memory cells, also known as row hammers. There is a problem in that the memory cells connected to the memory cell rows physically adjacent to each other are disturbed by the row hammer, thereby causing data corruption in which data flips.

Accordingly, there is a need for a method of managing and/or controlling the row hammer at the system level to meet RAS expectations.

SUMMARY

The disclosure provides memory modules including a row hammer counter chip, a memory system including the same, and a method of operating the memory system.

According to an aspect of the disclosure, there is provided a memory module including a plurality of data chips each of which is configured to store a data set corresponding to a plurality of burst lengths, and at least one row hammer counter chip including counter memory cells each of which is connected to a word line, among a plurality of word lines, for each of the plurality of data chips, wherein the at least one row hammer counter chip is configured to store in each of the counter memory cells connected to the word line, a number of times the word line is accessed for each of the plurality of data chips during a row hammer monitoring time frame.

According to another aspect of the disclosure, there is provided a memory system including: a memory module including a plurality of data chips and at least one row hammer counter chip, each of the plurality of data chips configured to store a data set corresponding to a plurality of burst lengths, and the at least one row hammer counter chip including counter memory cells each of which is connected to a word line, among a plurality of word lines of the plurality of data chips; and a memory controller configured to count a number of times the word line, among the plurality of word lines, of each of the plurality of data chips is accessed during a row hammer monitoring time frame, wherein the at least one row hammer counter chip is configured to store in each of the counter memory cells connected to the word line, the number of times the word line is accessed for each of the plurality of data chips.

According to another aspect of the disclosure, there is provided a method of operating a memory system including a memory module and a memory controller for controlling the memory module, wherein the memory module includes a plurality of data chips and a row hammer counter chip including counter memory cells each of which is connected to one of a plurality of word lines of the plurality of data chips, the method including: counting, by the memory controller, a number of times a word line, among the plurality of word lines, of each of the plurality of data chips is accessed during a row hammer monitoring time frame; and storing, by the memory controller, in each of the counter memory cells connected to the word line, the number of times the word line is accessed for each of the plurality of data chips.

BRIEF DESCRIPTION OF DRAWINGS

Embodiments of the disclosure will be more clearly understood from the following detailed description taken in conjunction with the accompanying drawings in which.

DETAILED DESCRIPTION

Figure 1:
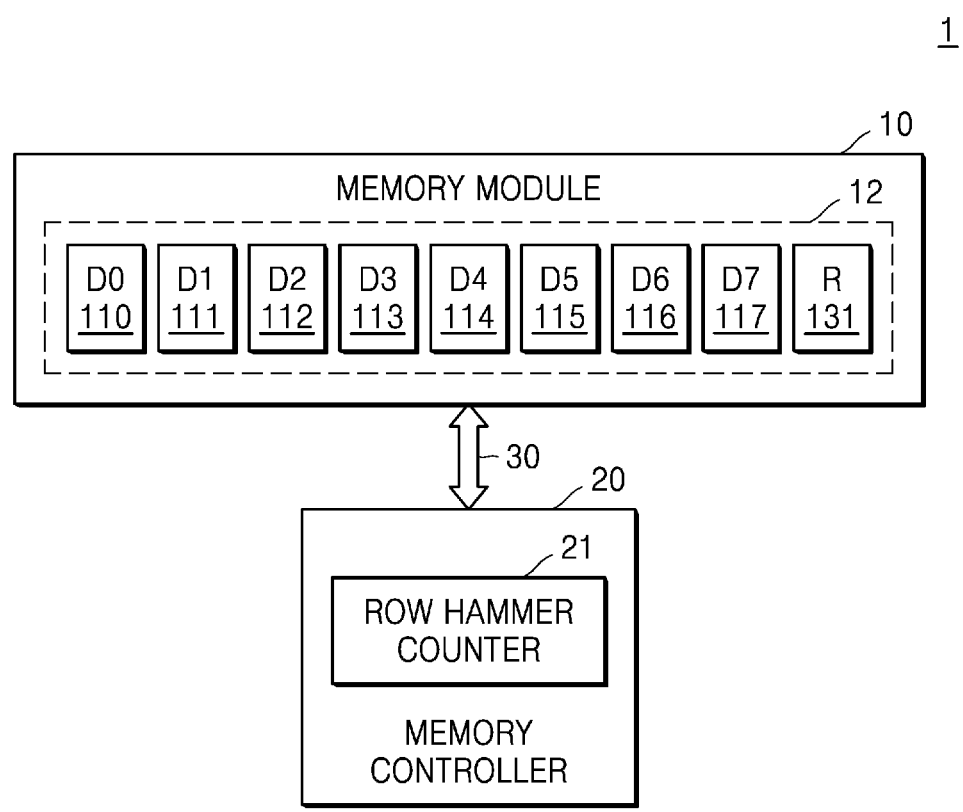
FIG. 1 is a diagram illustrating a memory system including a row hammer counter chip according to example embodiments of the disclosure.

FIG. 1 is a diagram illustrating a memory system including a row hammer counter chip according to example embodiments of the disclosure. A memory system 1 of FIG. 1 includes one row hammer counter chip 131 per memory channel 12 to store a number of times each of the memory cell rows of each of memory chips 110 to 117 is accessed. Each of the memory chips 110 to 117 may identify a memory cell row with more than a threshold number of times of access, among the number of times each of the memory cell rows are accessed stored in the row hammer counter chip 131, as a row-hammer-risky row, and may control the row-hammer-risky row to be target row refreshed.

Referring to FIG. 1, the memory system 1 may include a memory module 10 and a memory controller 20. The memory controller 20 may be communicatively connected to the memory module 10 through a memory bus 30. The memory module 10 may include a plurality of memory chips 110 to 117 and 131. According to an example embodiment, each of the memory chips 110 to 117 and 131 may be dynamic random access memory (DRAM) that performs the same memory transaction mechanism. According to an example embodiment, each of the memory chips 110 to 117 and 131 may be configured to use 16 bursts (burst length BL=16) per memory processing and provide 4 bits of information through the 4 pins of the chip, thereby performing a DDR5 mechanism with a 32-bit data width divided into 8 memory chips for an x4 implementation. Memory chips implementing the DDR5 mechanism of another example may use 16 bursts per memory processing (burst length BL=16), and may be split into 4 memory chips for an x8 implementation that provides 8 bits of information through the chip's 8 pins.

Figure 5:
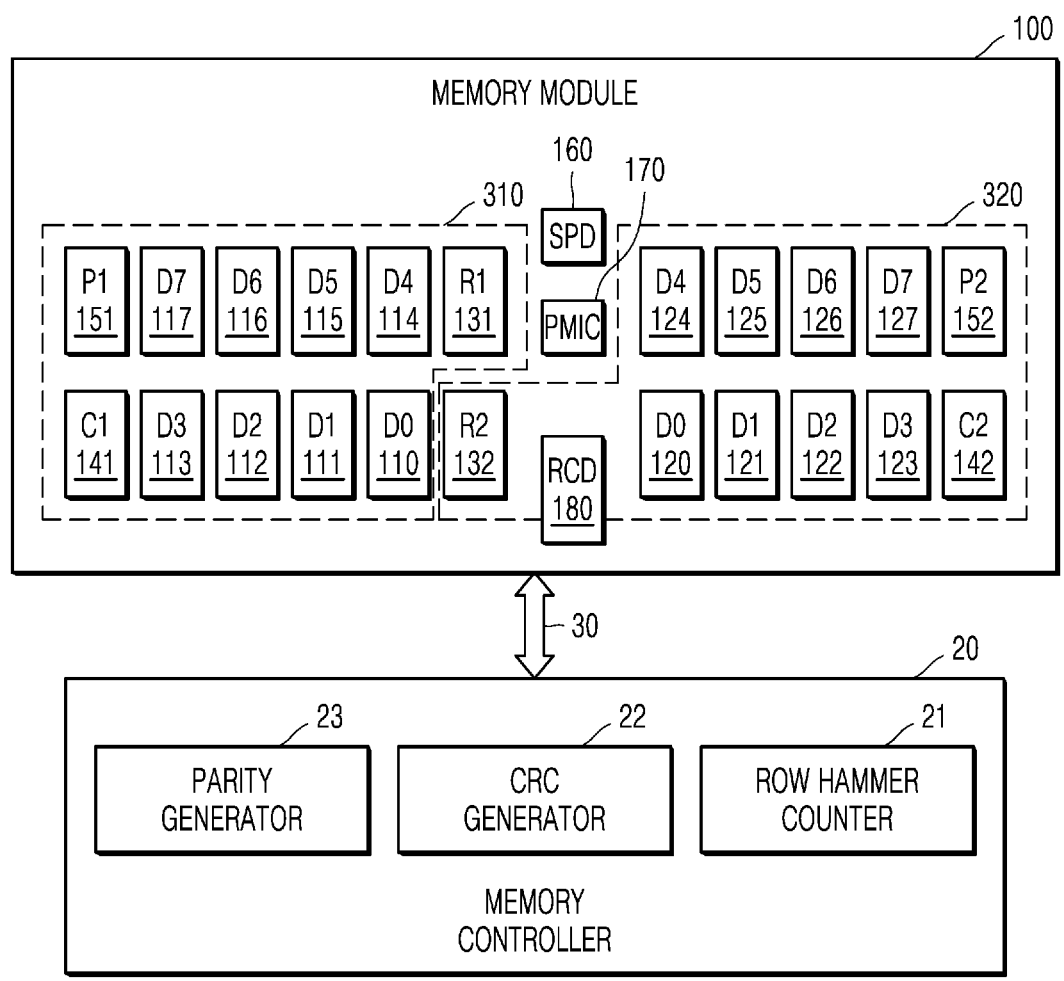
FIG. 5 is a diagram illustrating a memory system including a row hammer counter chip according to example embodiments of the disclosure.
Figure 8:
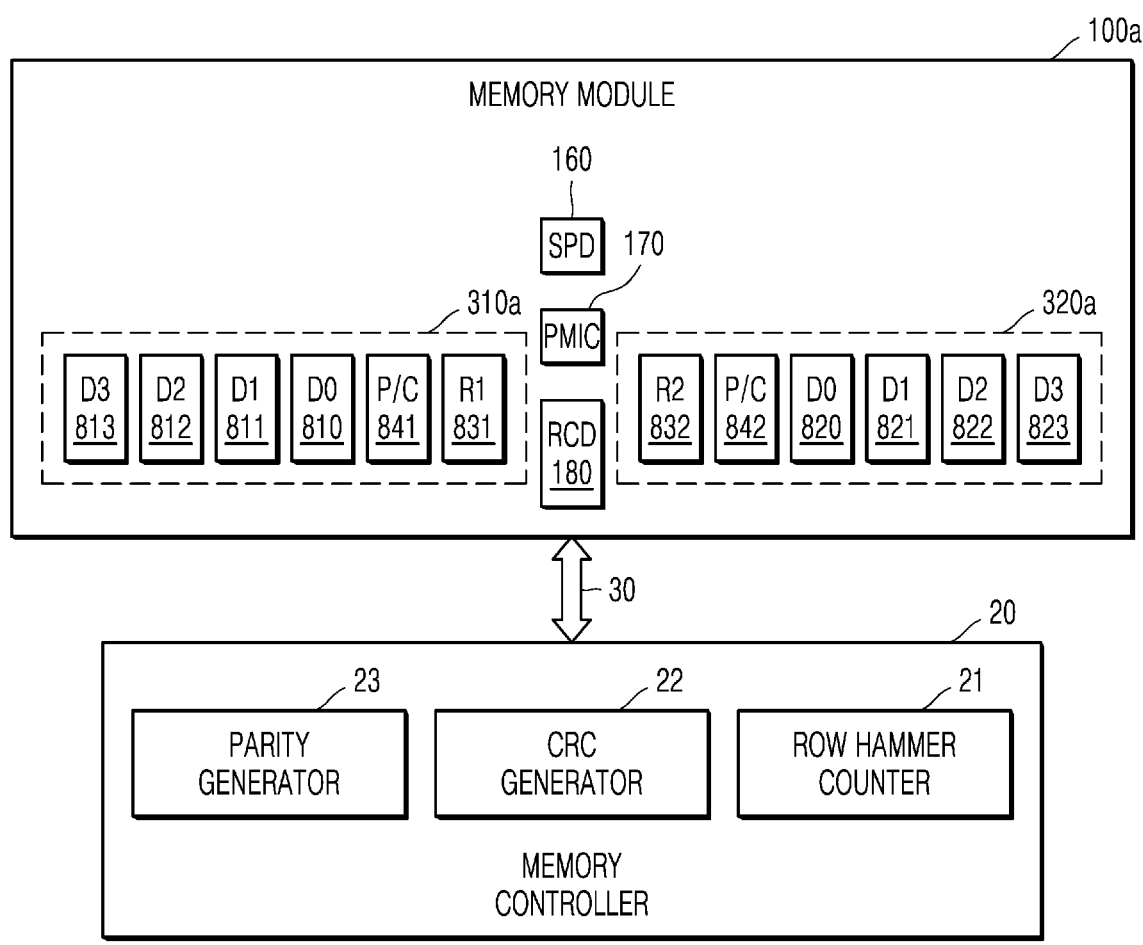
FIG. 8 is a diagram illustrating a memory system including a row hammer counter chip according to example embodiments of the disclosure.

The memory module 10 may include one memory channel 12 including the memory chips 110 to 117 and 131. The memory channel 12 may include eight data chips 110 to 117 and one row hammer counter chip 131. According to another example embodiment, the memory channel 12 may further include one error detection code chip 141 and one error correction code chip 151, as shown in FIG. 5. According to another example embodiment, the memory channel 12 may include four data chips, one row hammer counter chip 831, and one error correction/detection code chip 841, as shown in FIG. 8. However, the disclosure is not limited thereto, and as such different arrangement of chips may be provided.

The memory controller 20 may control overall operation of the memory system 1, and may control overall data exchange between an external host and the memory chips 110 to 117 and 131. For example, the host may be a computing system, such as a computer, a notebook computer, a server, a workstation, a portable communication terminal, a personal digital assistant (PDA), a portable multimedia player (PMP), a smartphone, or a wearable device. Alternatively, the host is a functional block configured to implement applications, such as learning systems, such as deep neural networks or applications, such as high-performance computing, graphics operations, and the like, and may include a processing unit such as a Central Processing Unit (CPU), a Digital Signal Processor (DSP), a Graphics Processing Unit (GPU), an Application Processor (AP) encryption processing unit, a physical processing unit, a machine learning processing unit, and the like.

The processing units of the host may control the memory module 10 through the memory controller 20 to implement applications. In some configurations, the processing unit and the memory controller 20 may include separate elements. In other configurations, it may be described that the memory controller 20 corresponds to a component provided in the processing unit of the host, and the processing unit controls the memory module 10.

The memory controller 20 may control the memory module 10 according to a memory request from a host. The memory controller 20 may control a write operation or a read operation performed on the memory chips 110 to 117 and 131 by providing a command and an address to the memory module 10. Also, data for a write operation and data read may be transmitted/received between the memory controller 20 and the memory module 10. These memory access operations are performed through a memory bus 30 between the memory controller 20 and the memory module 10, and may be referred to as memory processing.

The memory controller 20 and the memory module 10 may be communicatively coupled through a double data rate (DDR) DRAM interface used to perform memory access operations on the memory bus 30. The DDR DRAM interface may be a memory standard interface specification of the Joint Electron Device Engineering Council (JEDEC). According to an example embodiment, one or more memory modules 10 are connected to the memory controller 20 according to the DDR DRAM interface, but the disclosure is not limited thereto. The one or more memory modules 10 of the disclosure may be connected to the host through various types of communication interfaces other than the DDR DRAM interface. For example, the communication interface may include an Industry Standard Architecture (ISA) interface, a Peripheral Component Interconnect Express (PCIe) interface, a Serial Advanced Technology Attachment (SATA) interface, a Small Computer System Interface (SCSI) interface, a Serial Attached SCSI (SAS) interface, a universal storage bus (USB) Attached SCSI (UAS) interface, an Internet Small Computer System Interface (iSCSI) interface, a Fiber Channel, Fiber Channel over Ethernet (FCoE) interface, or the like.

The memory controller 20 may include a row hammer counter 21 for monitoring a row hammer for all memory cell rows of each of the data chips 110 to 117. The row hammer counter 21 may count a number of times each of the memory cell rows of each of the data chips 110 to 117 is accessed during a specific period of time. According to an example embodiment, the specific period of time is a preset time period. The preset time period may be set as a basic refresh rate time tREFi or a refresh window time tREFw as described below with reference to FIG. 4. The memory controller 20 may store the number of times of access for each of the memory cell rows as counted by the row hammer counter 21, in the memory cell row of the row hammer counter chip 131 corresponding to the memory cell row of the data chips 110 to 117.

The memory controller 20 may provide the number of times of access of each of the memory cell rows of each of the data chips 110 to 117, which is stored in the row hammer counter chip 131, to the corresponding data chips 110 to 117. In each of the data chips 110 to 117, memory cell rows for which the number of times of access is greater than or equal to a threshold may be identified as row-hammer-risky rows to be target row refreshed.

In general, DRAM uses a limited number of registers to manage the row hammer, and the number of hammer addresses may be determined by the number of historical access times for a given time, and further, may be determined by the number of registers storing the number of times of access. As the hammer addresses are newly stored in the registers, the hammer addresses stored in the registers may be evicted from the registers, and thus, monitored row hammer information may be lost. There is a problem in that the evicted hammer address is vulnerable to the row hammer. To solve this problem, the row hammer counter 21 and the row hammer counter chip 131 may provide a per-row hammer tracking (PRHT) function for each of the data chips 110 to 117 without row hammer information loss. The PRHT function monitors a row hammer based on the number of times of access of all memory cell rows of each of the data chips 110 to 117, thereby preventing a missing hammer address.

According to an example embodiment, the row hammer counter chip 131 may store metadata related to data stored in each of the data chips 110 to 117, or store chipkill error data for disabling a nonfunctional data chip among the data chips 110 to 117.

Figure 2:
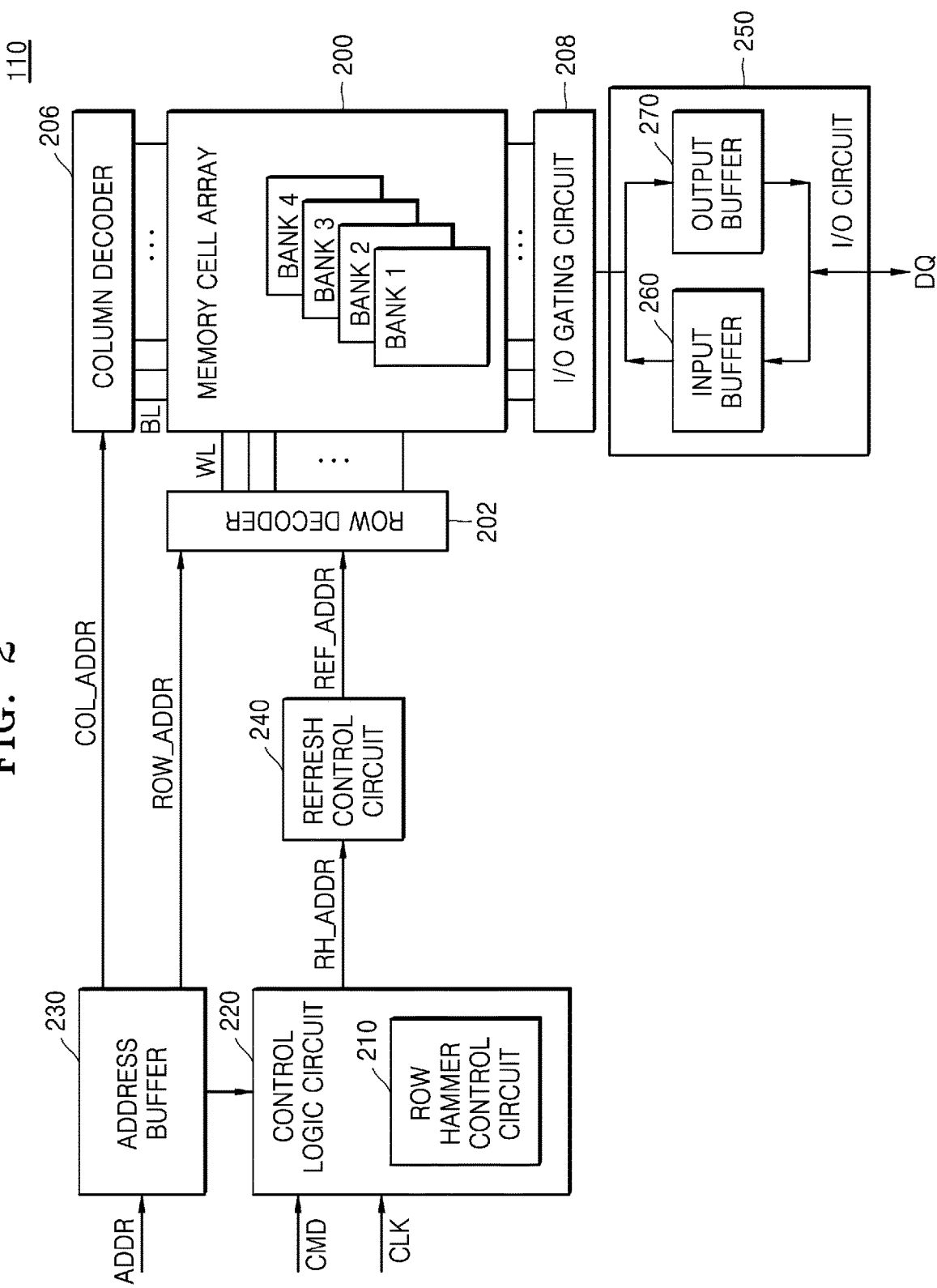
FIG. 2 is a block diagram illustrating a memory device according to embodiments of the disclosure.
Figure 3:
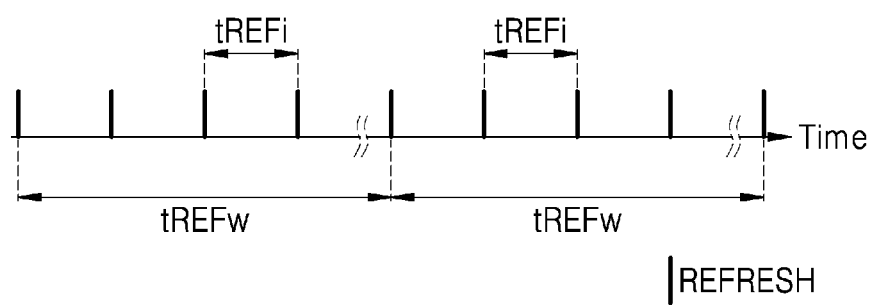
FIG. 3 is a view for explaining a refresh operation of the memory device of FIG. 2.

FIG. 2 is a block diagram illustrating a memory device according to example embodiments of the disclosure. FIG. 3 is a diagram for explaining a refresh operation of the memory device of FIG. 2. FIG. 2 shows the memory chip 110 as a representative memory chip among the memory chips 110 to 117 and 131 of FIG. 1. While the DRAM configuration shown in FIG. 2 is provided as an example, the disclosure is not limited thereto, and as such, a DRAM may have other configurations. Furthermore, the DRAM configuration shown in FIG. 2 as an example does not represent or imply limitations on the present disclosure. For convenience of description, the memory chip 110 may be a memory device or a DRAM chip and hereinafter referred to as a memory device.

Referring to FIGS. 1 and 2, the memory device 110 may include a memory cell array 200, a row decoder 202, a column decoder 206, an input and output (i.e., input/output (I/O)) gating circuit 208, a control logic circuit 220, an address buffer 230, a refresh control circuit 240, and an I/O circuit 250. According to an example embodiment, the memory device 110 may further include a clock buffer, a mode register set (MRS), a bank control logic, a voltage generating circuit, and the like.

The address buffer 230 may receive an address ADDR including a bank address, a row address ROW_ADDR, and a column address COL_ADDR from the memory controller 20. The address buffer 230 may provide the received bank address to the bank control logic, provide the received row address ROW_ADDR to the row decoder 202, and provide the received column address COL_ADDR to the column decoder 206.

The memory cell array 200 includes a plurality of memory cells provided in a matrix form arranged in rows and columns. The memory cell array 200 includes a plurality of word lines WL and a plurality of bit lines BL connected to the memory cells. The plurality of word lines WL may be connected to rows of memory cells, and the plurality of bit lines BL may be connected to columns of memory cells. Data of memory cells connected to an activated word line WL may be sensed and amplified by sense amplifiers connected to the bit lines BL.

The memory cell array 200 may include a first bank BANK 1, a second bank BANK 2, a third band BANK 3, and a fourth bank BANK 4. The bank control logic generates bank control signals based on the bank address, and the row decoder 202 and the column decoder 206 of a bank corresponding to a bank address among the first bank BANK 1, the second bank BANK 2, the third band BANK 3, and the fourth bank BANK 4 may be activated based on the bank control signals. Although an example embodiment shows an example of the memory device 110 including four banks, the memory device 110 may include any number of banks depending on the embodiment.

The row decoder 202 and the column decoder 206 may be provided to correspond to each of the first bank BANK 1, the second bank BANK 2, the third band BANK 3, and the fourth bank BANK 4, and the row decoder 202 and the column decoder 206 connected to the bank corresponding to the bank address may be activated. The row decoder 202 may decode the row address ROW_ADDR received from the address buffer 230 to select a word line WL corresponding to the row address ROW_ADDR from among the plurality of word lines WL, and connect to a word line driver that activates the selected word line WL.

The column decoder 206 may select preset bit lines BL from among a plurality of bit lines BL of the memory cell array 200. The column decoder 206 may generate a column selection signal by decoding a burst address that is gradually increased by +1 based on the column address COL_ADDR in the burst mode, and connect the bit lines BL selected by the column selection signal to the I/O gating circuit 208. Burst addresses refer to addresses of column locations that may be accessed in terms of burst length BL for read and/or write commands.

Figure 6:
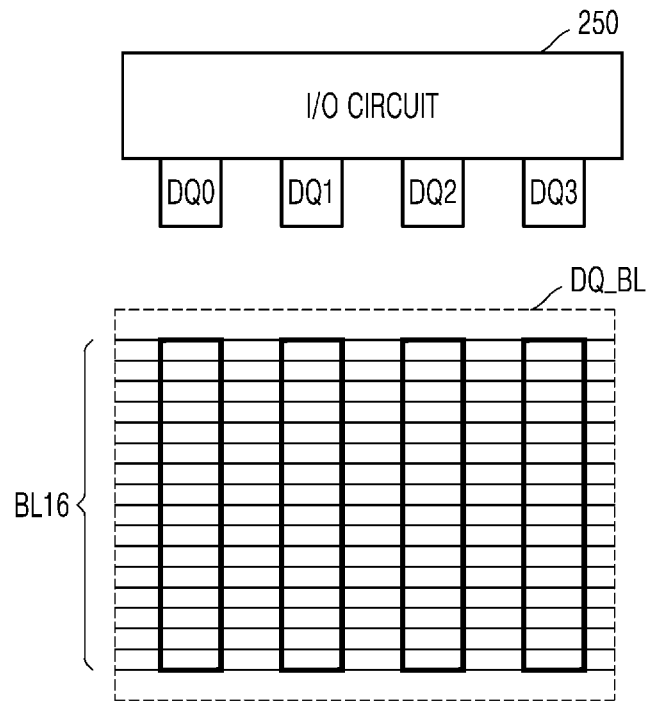
FIG. 6 is a diagram for explaining a data architecture of each of the memory chips of FIG. 5.
Figure 9:
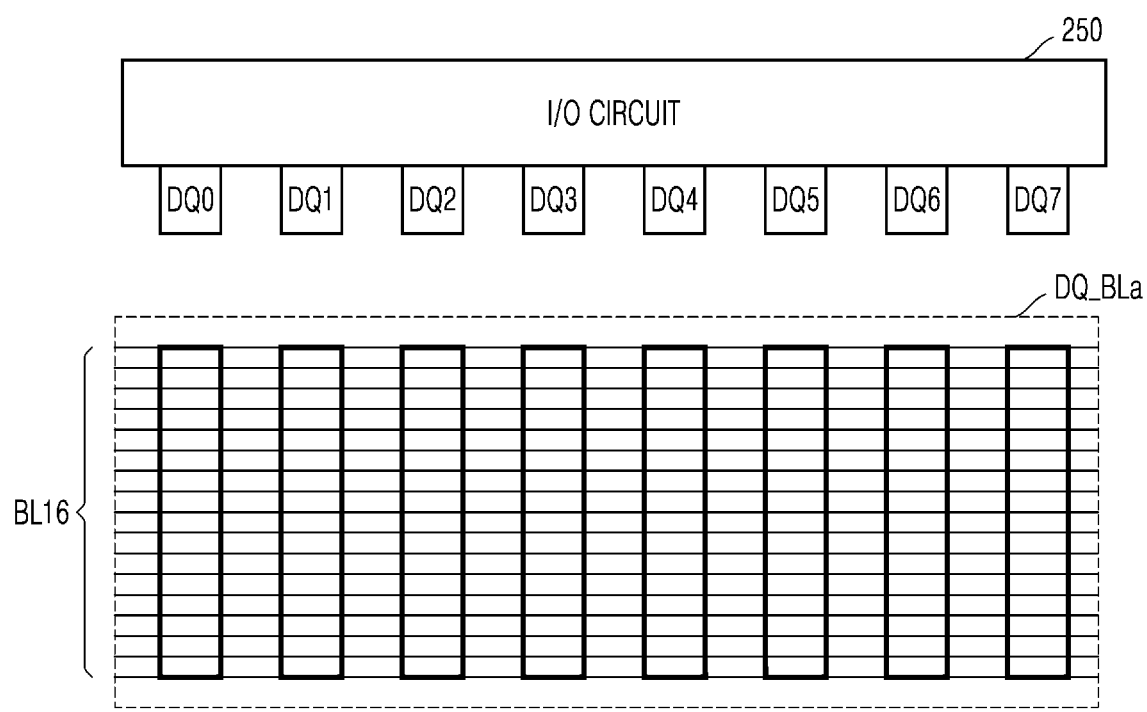
FIG. 9 is a view for explaining a data architecture of each of memory chips of FIG. 8.

The I/O gating circuit 208 may include read data latches for storing read data of the bit lines BL selected by the column select signal, and a write driver for writing write data into the memory cell array 200. The I/O circuit 250 may include a data input buffer 260 and a data output buffer 270. The read data stored in the read data latches of the I/O gating circuit 208 may be provided to a data DQ bus through the data output buffer 270. Write data may be written to the memory cell array 200 through the data input buffer 260 coupled to the data DQ bus and through the write driver of the I/O gating circuit 208. According to an example embodiment, the I/O circuit 250 may input/output a 64-bit data set DQ_BL per memory processing through four pins DQ0 to DQ3, as shown in FIG. 6. According to another example embodiment, as shown in FIG. 9, the I/O circuit 250 may input/output a 128-bit data set DQ_BLa per memory processing through eight pins DQ0 to DQ7.

The control logic circuit 220 may receive a clock signal CLK and the command CMD and may generate control signals for controlling an operation timing and/or a memory operation of the memory device 110. The control logic circuit 220 may provide control signals to circuits of the memory device 110 to operate as set in the operation and control parameters stored by the MRS. The control logic circuit 220 may read data from and write data to the memory cell array 200 by using control signals. Although the control logic circuit 220 and the address buffer 230 are illustrated as separate components in FIG. 2, the control logic circuit 220 and the address buffer 230 may be implemented as inseparable single component. In addition, although it is illustrated in FIG. 2 that the command CMD and an address may be considered to be included in a command as by the DDR standard or LPDDR standard, and the like.

The control logic circuit 220 may receive the number of times of access of each of the memory cell rows in the memory cell array 200 of the memory device 110 from the row hammer counter chip 131 of the memory module 10. The control logic circuit 220 may include a row hammer control circuit 210 that determines whether the number of times of access of any of the memory cell rows is greater than or equal to a threshold, and identifies a memory cell row for which the number of times of access is equal to or greater than the threshold as a row-hammer-risky row.

The row hammer control circuit 210 may be configured to monitor a row hammer for a memory cell row for which the number of times of access is equal to or greater than a threshold in the memory cell array 200 and to detect a row hammer of a particular memory cell row. A particular memory cell row refers to a memory cell row for which the number of times of access is greater than or equal to the threshold during a preset time period. As shown in FIG. 3, the preset time period may be set to a 32 ms or 64 ms refresh window time tREFw defined by the JEDEC standard. According to an example embodiment, the preset time period may be set as a basic refresh rate time tREFi, as shown in FIG. 3. The basic refresh rate is defined as, for example, the number of refresh commands REFRESH on the order of 8K within a 32 ms refresh window. A preset time period may be referred to as a row hammer monitor time frame or time window set by the memory controller 20.

According to an example embodiment, the row hammer control circuit 210 may transmit information on the detected row-hammer-risky row to the memory controller 20. The memory controller 20 may issue a normal refresh command based on row-hammer-risky row information. The memory controller 20 may transmit an address signal of one or more memory cell rows physically adjacent to a row-hammer-risky row to the memory device 110 together with a refresh command. The memory device 110 may refresh the one or more memory cell rows physically adjacent to the row-hammer-risky row, according to a normal refresh command.

According to an example embodiment, the row hammer control circuit 210 may be configured to target refresh a row of memory cells physically adjacent to a row-hammer-risky row. The row hammer control circuit 210 collectively refers to those implemented in hardware, firmware, software, or a combination thereof for controlling or managing the row hammer. In the following embodiment, it will be described that the row hammer control circuit 210 controls the row hammer accessed above a threshold during the row hammer monitoring time frame, but embodiments of the disclosure are not limited thereto. For example, it may be described that the row hammer control circuit 210 corresponds to a configuration provided in the control logic circuit 220, and the control logic circuit 220 controls the row hammer.

The control logic circuit 220 may control the refresh control circuit 240 to perform a normal refresh operation by increasing the refresh counter value by +1, based on the refresh command CMD. Also, the control logic circuit 220 may control the refresh control circuit 240 to perform a target row refresh operation, based on the row hammer addresses RH_ADDR. The refresh control circuit 240 may generate a refresh address REF_ADDR corresponding to a memory cell row on which a normal refresh operation or a target row refresh operation is to be performed. Moreover, the refresh control circuit 240 may generate a refresh address REF_ADDR corresponding to a memory cell row on which a normal refresh operation and a target row refresh operation are to be performed.

Figure 4:
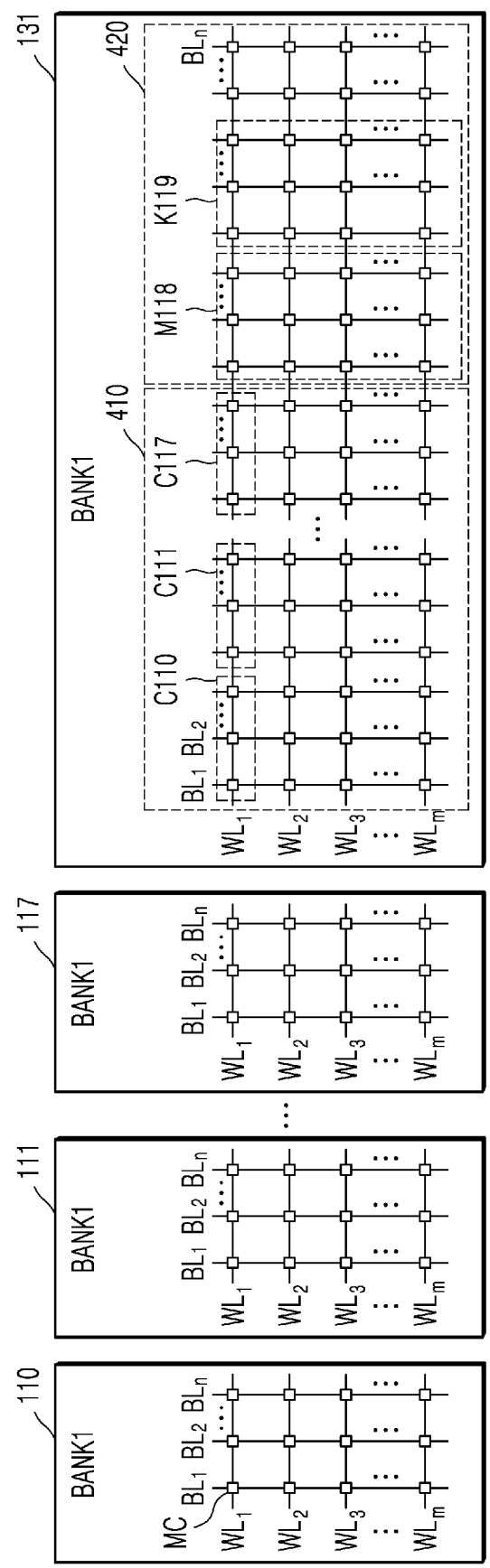
FIG. 4 is a diagram conceptually illustrating an example in which a memory cell array of a row hammer counter chip is configured according to embodiments of the disclosure.

FIG. 4 is a diagram conceptually illustrating an example in which a memory cell array of a row hammer counter chip is configured according to an example embodiment of the disclosure. FIG. 4 shows a first bank BANK 1 as an exemplified part of the memory cell array 200 (see FIG. 2) in the row hammer counter chip 131 of FIG. 1. Descriptions related to the first bank BANK 1 may be equally applied to the second to fourth banks BANK2 to BANK 4.

Referring to FIGS. 1, 2, and 4, in the row hammer counter chip 131 of the memory module 10, the first bank BANK 1 may include a plurality of word lines WL1 to WLm and bit lines BL1 to BLn, like the data chips 110 to 117. The plurality of memory cells MC may be positioned at intersections of the word lines WL1 to WLm and the bit lines BL1 to BLn. In the row hammer counter chip 131, the memory cells MC connected to the respective word lines WL1 to WLm may be divided into first memory cells 410 and second memory cells 420.

The first memory cells 410 connected to each of the word lines WL1 to WLm may include preset counter memory cells C110 to C117 storing the number of times of access of the corresponding word lines WL1 to WLm of the data chips 110 to 117. For example, the counter memory cells C110 to C117 connected to the first word line WL1 may store the number of times of access for activating the memory cell row of the first word line WL1 of each of the data chips 110 to 117. The first counter memory cells C110 may store the number of times of access of the first word line WL1 of the first data chip 110, the second counter memory cells C111 may store the number of times of access of the first word line WL1 of the second data chip 111, and similarly, the seventh counter memory cells C117 may store the number of times of access of the first word line WL1 of the seventh data chip 117.

The first to seventh counter memory cells C110 to C117 may also be repeated in each of the second bank BANK 2, the third bank BANK 3 and the fourth bank BANK 4 of the memory cell array 200. The number and positions of the first to seventh counter memory cells C110 to C117 may be reconfigured according to a greatest number of times of access expected by the memory controller 20. Depending on the embodiment, there may be between 8 and 24 counter memory cells along each word line. For example, the counter memory cells may include 8, 12, 16, or 24 counter memory cells. In other examples, more or fewer counter memory cells may be used.

The second memory cells 420 may store metadata supposed to be stored together with data stored in the data chips 110 to 117. Metadata may include data-related validity, identification parameters, compression information, file properties, security or access control information, and the like. Additionally, the metadata may include vendor metadata related to an information of the memory module 10. For example, in the case of security metadata, it is possible to check whether an operation related to data access is permissible or correct.

The second memory cells 420 may include preset metadata cells M118 for storing metadata related to data stored in the data chips 110 to 117. The number and location of the metadata cells M118 may be reconfigured according to metadata provided by the memory controller 20. Depending on the embodiment, there may be between 3 and 32 metadata cells along each word line. For example, the number of metadata cells may be 3, 8, 16, or 32. In other examples, more or fewer metadata cells may be used.

The second memory cells 420 may be used to support chipkill mechanisms for erasing or disabling the nonfunctional data chips among the data chips 110 to 117. Additionally or alternatively, the chipkill mechanism may be supported in an error correction code chip (e.g., an ECC chip 141 of FIG. 5) instead of the row hammer counter chip 131.

When the memory controller 20 recognizes the occurrence of an error in the memory module 10, the memory controller 20 may attempt to determine an error pattern. Depending on the error pattern, the memory controller 20 may determine whether the error corresponds to a random error (non-permanent error), a permanent error, or a chipkill error. According to the determination of the type of error, the memory controller 20 may perform error correction. Among the different kinds of errors, one kind of error may be referred to as a chipkill error. A chipkill error generally corresponds to a permanent failure of one chip/die or chip that exceeds a threshold of bit errors.

Failure of one data chip of the memory channel 12 may cause a large number of errors with the data chip providing incorrect data in a large number of bursts during memory processing. Accordingly, when all detected errors correspond to one data chip, the memory controller 20 may support a chipkill error for displaying one data chip as an erased chip.

The memory controller 20 may store the chipkill error data in the chipkill error data cell K119 of the second memory cells 420. Nonfunctional data chips may be deactivated by the chip-kill error data stored in the chip-kill error data cell K119. The number and location of the chip-kill error data cells K119 may be reconfigured according to the chip-kill error data provided by the memory controller 20.

As described above, the row hammer counter chip 131 may provide an increased RAS function because it provides the row hammer coverage, metadata and/or chipkill coverage.

Figure 7:
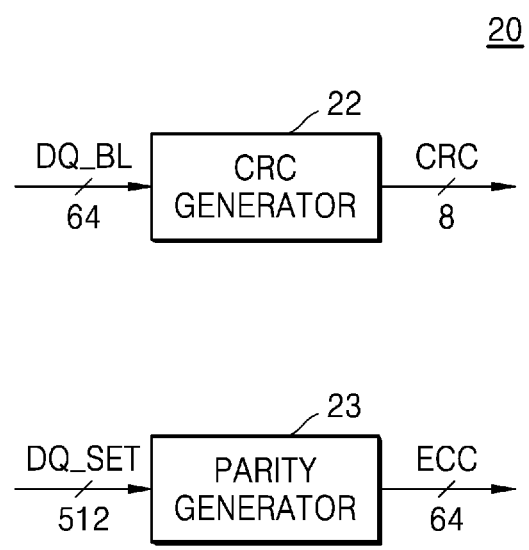
FIG. 7 is a block diagram illustrating an error detection code generator and an error correction code generator of the memory controller of FIG. 5.

FIG. 5 is a diagram illustrating a memory system including a row hammer counter chip according to example embodiments of the disclosure. FIG. 6 is a diagram for explaining a data architecture of each of the memory chips 110 to 117, 120 to 127, 131, 132, 141, 142, 151, and 152 of FIG. 5. FIG. 7 is a block diagram illustrating an error detection code generator 22 and an error correction code generator 23 of the memory controller 20 of FIG. 5.

Referring to FIG. 5, a memory system 4 may include a memory module 100 and a memory controller 20. The memory module 100 shows one memory rank implemented as a double data rate synchronous dynamic random-access memory dual in-line memory module (DDR DIMM). The memory controller 20 may transmit data to the various memory chips 110 to 117, 120 to 127, 131, 132, 141, 142, 151, and 152 of the memory module 100, and receive data from various memory chips 110 to 117, 120 to 127, 131, 132, 141, 142, 151, and 152.

Illustratively, as shown in FIG. 6, each of the memory chips 110 to 117, 120 to 127, 131, 132, 141, 142, 151, and 152 may include four pins DQ0 to DQ3 connected to the I/O circuit 250, use 16 bursts per memory transaction (burst length BL=16), and provide 4 bits of information through 4 pins DQ0 to DQ3. Accordingly, a 64-bit data set DQ_BL per memory processing may be input/output to/from each of the memory chips 110 to 117, 120 to 127, 131, 132, 141, 142, 151, and 152.

The memory module 100 of FIG. 5 may include two memory channels 310 and 320 for each memory rank. Each of the memory channels 310 and 320 may include 8 data chips dedicated to storing data, one row hammer counter chip (hereinafter, referred to as RH chip), one error correction code chip (hereinafter, referred to as ECC chip), and one error detection code chip (hereinafter, referred to as CRC chip). The error detection code may include a cyclic redundancy check. For convenience of description, an error correction code may be used interchangeably with an ECC code, and an error detection code may be used interchangeably with a CRC code. The first memory channel 310 may include eight data chips 110 to 117, one RH chip 131, one CRC chip 141, and one ECC chip 151. The second memory channel 320 may include eight data chips 120 to 127, one RH chip 132, one CRC chip 142, and one ECC chip 152.

Since each of the memory channels 310 and 320 includes eight 4-bit data chips 110 to 117, and 120 to 127 dedicated to storing data, the data width for each of the memory channels 310 and 320 is 32 bits. In addition, because of using 16 bursts per memory process (burst length BL=16), 512 bits per each of the memory channels 310 and 320 for each memory process are transmitted. The 512 bits per each of the memory channels 310 and 320 may be referred to as a user data set.

The memory channels 310 and 320 include the RH chips 131 and 132, respectively. The RH chips 131 and 132 of the memory channels 310 and 320 may respectively store the numbers of times accessing the word lines of the data chips 110 to 117 and 120 to 127.

The RH chips 131 and 132 of the memory channels 310 and 320 may respectively store the numbers of times accessing the word lines of the data chips 110 to 117 and 120 to 127. The first RH chip 131 of the first memory channel 310 may store metadata related to the number of times of access of the word lines corresponding to each of the data chips 110 to 117 and/or data stored in each of the data chips 110 to 117. The second RH chip 132 of the second memory channel 320 may store metadata related to the number of times of access of the corresponding word lines of each of the data chips 120 to 127 and/or data stored in each of the data chips 120 to 127.

Additionally, the respective RH chips 131 and 132 of the memory channels 310 and 320 may store chipkill error data for disabling nonfunctional data chip(s) in each of the memory channels 310 and 320. The first RH chip 131 of the first memory channel 310 may store chipkill error data for inactivating nonfunctional data chip(s) among the data chips 110 to 117. The second RH chip 132 of the second memory channel 320 may store chipkill error data for inactivating nonfunctional data chip(s) among the data chips 120 to 127.

The memory channels 310 and 320 include CRC chips 141 and 142, respectively. The CRC chips 141 and 142 respectively of the memory channels 310 and 320 may store CRC data associated with 64 bits of a data set DQ_BL corresponding to a burst length BL=16 of each of the data chips 110 to 117 and 120 to 127. The first CRC chip 141 of the first memory channel 310 may store error detection code CRC bits generated based on 64 bits of the data set DQ_BL of each of the data chips 110 to 117. The second CRC chip 142 of the second memory channel 320 may store error detection code CRC bits generated based on 64 bits of the data set DQ_BL of each of the data chips 120 to 127.

The ECC width for each of the memory channels 310 and 320 is 4 bits because one of the ECC chips 141 and 142 is included. 36 bits per each of the memory channels 310 and 320 are sent for each burst, which corresponds to a total of 576 bits per memory processing of each of the memory channels 310 and 320. It will be understood that the user data set is 512 bits and the remaining 64 bits correspond to the ECC data of the respective ECC chips 141 and 142 of the memory channels 310 and 320.

The memory controller 20 may include a row hammer counter 21, a CRC generator 22, and a parity generator 23. The row hammer counter 21 may count the number of active accesses of the word lines of each of the data chips 110 to 117 and 120 to 127 of the memory module 100 during the row hammer monitor time frame. The row hammer counter 21 may store the number of times of access of the word lines of each of the data chips 110 to 117 in the counter memory cells C110 to C117 (see FIG. 4) connected to corresponding word lines of the first RH chip 131 of the first memory channel 310. Likewise, the row hammer counter 21 may store the number of times of access of the word lines of each of the data chips 120 to 127 in the counter memory cells connected to the corresponding word lines of the second RH chip 132 of the second memory channel 320.

In FIG. 7, the CRC generator 22 may generate an 8-bit error detection code CRC based on the 64-bit data set DQ_BL corresponding to the burst length BL=16 to be provided to each of the data chips 110 to 117 and 120 to 127 of each of the memory channels 310 and 320. Accordingly, the CRC generator 22 may generate a 64-bit CRC bit for each of the memory channels 310 and 320. The CRC generator 22 may store the 64-bit CRC bits generated based on the data sets DQ_BL of the eight data chips 110 to 117 in the first CRC chip 141 of the first memory channel 310. The CRC generator 22 may store the 64-bit CRC bit generated based on the data set DQ_BL of each of the eight data chips 120 to 127 in the second CRC chip 142 of the second memory channel 320.

The parity generator 23 may generate a 64-bit error correction code ECC based on the user data set DQ_SET corresponding to all of the 64-bit data sets DQ_BL corresponding to the burst length BL=16 to be provided to the data chips 110 to 117 and 120 to 127 of each of the memory channels 310 and 320. The user data set DQ_SET is 512 bits, and the parity generator 23 may be configured as an ECC encoder.

The 64-bit ECC bits for the 512-bit user data set DQ_SET of the first memory channel 310 may be provided to the first memory channel 310 together with the user data set DQ_SET. 512 bits of the user data set DQ_SET of the first memory channel 310 may be stored in the data chips 110 to 117, and ECC bits of 64 bits may be stored in the first ECC chip 151. After this, the memory controller 20 is to transmit a particular command to the memory module 100, and is to receive information in the ECC bits stored in the first ECC chip 151 during memory processing with the first memory channel 310. When the memory controller 20 detects an error in the data of the data chips 110 to 117, the memory controller 20 may correct a 1-bit error in the 512-bit data of the first memory channel 310 by using the 64-bit ECC bit.

Similarly, the 64-bit ECC bits for the 512-bit user data set DQ_SET of the second memory channel 320 may be provided to the second memory channel 320 together with the user data set DQ_SET. 512 bits of the user data set DQ_SET of the second memory channel 320 may be stored in the second data chips 120 to 127, and ECC bits of 64 bits may be stored in the second ECC chip 152. A 1-bit error within 512 bits of the second memory channel 320 may be corrected by using the 64-bit ECC bit.

Accordingly, since the memory module 100 may correct a 1-bit error per each of the memory channels 310 and 320 using the ECC chips 141 and 142, a 2-bit error may be corrected.

Returning to FIG. 5, the memory module 100 may further include a serial presence detect chip (hereinafter SPD chip) 160, a power management integrated circuit chip (hereinafter, referred to as PMIC chip), 170 and a Registering Clock Driver chip (hereinafter, referred to as RCD chip) 180. The SPD chip 160 may store extended RAS information related to row hammer coverage, metadata, and/or chipkill coverage for the row hammer counter chips 131 and 132 per the respective memory channels 310 and 320. Also, the SPD chip 160 may include device information of the memory module 100. For example, the SPD chip 160 may include initial information or device information such as a module type, module configuration, storage capacity, module type, implement environment, and the like of the memory module 100.

When the memory system 4 is booted, the memory controller 20 may read device information from the SPD chip 160 of the memory module 100 and recognize the memory module 100 based on the read device information. The memory controller 20 may control the memory module 100 based on device information and extended RAS information from the SPD chip 160. For example, the memory controller 20 may identify the memory channel(s) and memory chips included in the memory module 100 according to device information from the SPD chip 160, and may control the row hammer counter chip of each memory channel according to the extended RAS information.

The PMIC chip 170 may generate a power supply voltage based on an input voltage and provide the generated power supply voltage to the memory chips 110 to 117, 210 to 217, 131, 132 141, 142, 151 and 152. The memory chips 110 to 117, 210 to 217, 131, 132, 141, 142, 151, and 152 may operate based on a power supply voltage.

The RCD chip 180 may control the memory chips 110 to 117, 210 to 217, 131, 132, 141, 142, 151, 152, the SPD chip 160, and the PMIC chip 170 under the control of the memory controller 20. For example, the RCD chip 180 may receive a command, an address, a clock signal and a control signal from the memory controller 20 through the memory bus 30, and may perform a buffer function for distributing the received signals to the first memory channel 310 and the second memory channel 320. The memory chips 110 to 117, 210 to 217, 131, 132, 141, 142, 151, and 152 of each of the memory channels 310 and 320 perform data exchange with the memory controller 20 based on a command, address, clock signal and control signal provided from the RCD chip 180.

As mentioned above, when performing the DDR5 mechanism divided into 8 data chips 110 to 117 and 210 to 217 for an x4 implementation for each of the memory channels 310 and 320, since the memory module 100 provides row hammer coverage, metadata, and/or chipkill coverage using the row hammer counter chips 131 and 132, it is possible to provide an increased RAS function.

FIG. 8 is a diagram illustrating a memory system including a row hammer counter chip according to example embodiments of the disclosure. FIG. 9 is a view for explaining a data architecture of each of the memory chips 810 to 813, 820 to 823, 831, 832, 841 and 842 of FIG. 8. Hereinafter, subscripts (e.g., a in 100*a*) attached to the same reference numbers in different drawings are used to distinguish a plurality of circuits having similar or identical functions.

Referring to FIG. 8, the memory system 6 may include a memory module 100*a* and a memory controller 20. Compared with the memory module 100 of FIG. 5, the memory module 100*a* of FIG. 8 shows that the number of memory chips 810 to 813, 820 to 823, 831, 832, 841, and 842 of each of the memory channels 310 and 320 is different, and the remaining components are the same. Hereinafter, differences from FIG. 5 will be mainly described.

In the memory module 100*a*, as shown in FIG. 9, the memory chips 810 to 813, 820 to 823, 831, 832, 841, 842 of each of the memory channels 310 and 320 may include eight pins DQ0-DQ7 connected to the I/O circuit 250, use 16 bursts per memory transaction (burst length BL=16), and provide 8 bits of information via 8 pins DQ0 to DQ7. Accordingly, a 128-bit data set DQ_BL per memory processing may be input/output to/from each of the memory chips 810 to 813, 820 to 823, 831, 832, 841, and 842.

In the memory module 100a of FIG. 8, each of the memory channels 310 and 320 may include four data chips, one row hammer counter chip, and one error correction/detection code chip. The first memory channel 310 may include four data chips 810 to 813, one row hammer counter chip 831, and one error correction/detection code chip 841. The second memory channel 320 may include four data chips 820 to 823, one row hammer counter chip 832, and one error correction/detection code chip 842.

Since each of the memory channels 310 and 320 includes four 8-bit data chips 810 to 813 and 820 to 823 dedicated to storing data, the data width for each of the memory channels 310 and 320 is 32 bits. In addition, because of using 16 bursts per memory process (burst length BL=16), 512 bits per each of the memory channels 310 and 320 for each memory process are transmitted.

The CRC generator 22 may generate a 16-bit error detection code CRC based on the 128-bit data set DQ_BLa corresponding to the burst length BL=16 to be provided to each of the data chips 810 to 813 and 820 to 823 of each of the memory channels 310 and 320. Accordingly, the CRC generator 22 may generate a 64-bit CRC bit for the four data chips 810 to 813 and 820 to 823 for each of the memory channels 310 and 320.

The parity generator 23 may generate a 64-bit error correction code ECC based on 512 bits of the user data set DQ_SET corresponding to all of the 128-bit data sets DQ_BLa corresponding to the burst length BL=16 to be provided to the data chips 810 to 813 and 820 to 823 of each of the memory channels 310 and 320.

The memory channels 310 and 320 include row hammer counter chips 831 and 832, respectively. The respective row hammer counter chips 831 and 832 of the memory channels 310 and 320 may store the number of times of access of the word lines corresponding to each of the data chips 810 to 813 and 820 to 823. Additionally, the respective row hammer counter chips 831 and 832 of the memory channel 310 and 320 may store metadata related to data stored in each of the data chips 810 to 813 and 820 to 823 and/or chipkill error data for disabling nonfunctional data chip(s) in each of the memory channels 310 and 320.

The memory channel 310 and 320 include error correction/detection code chips 841 and 842, respectively. The respective error correction/detection code chips 841 and 842 of the memory channels 310 and 320 store 64-bit CRC bits for the data chips 810 to 813 and 820 to 823 generated by the CRC generator 22. The respective error correction/detection code chips 841 and 842 of the memory channels 310 and 320 may store 64-bit ECC bits for the data chips 810 to 813 and 820 to 823 generated by the parity generator 23.

As mentioned above, when performing the DDR5 mechanism divided into 4 data chips 810 to 813 and 820 to 823 for ×8 implementation for each of the memory channels 310 and 320, since the memory module 100a provides row hammer coverage, metadata, and/or chipkill coverage using the row hammer counter chips 831 and 832, it is possible to provide an increased RAS function.

Figure 10:
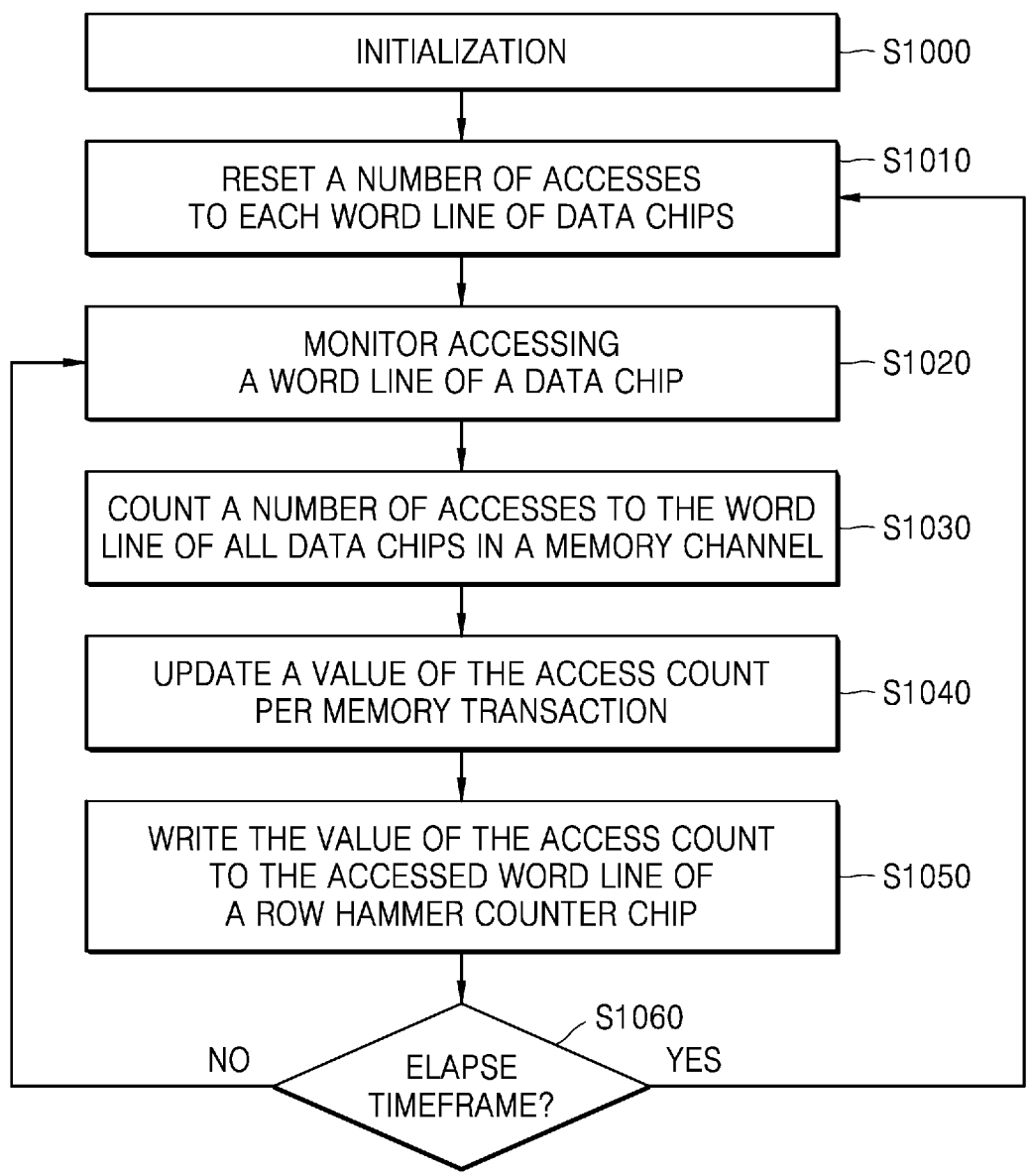
FIG. 10 is a flow diagram illustrating an operation of a memory system including a row hammer counter chip according to embodiments of the disclosure.

FIG. 10 is a flow diagram illustrating an operation of a memory system including a row hammer counter chip according to embodiments of the disclosure.

Referring to FIG. 10 in conjunction with FIGS. 1 to 4, the memory system 1 may perform initialization in operation S1010. When the memory system 1 is powered up, the memory controller 20 and the memory module 10 may perform an initial setting operation according to a preset method. Default operation parameters may be set in initialization of the memory module 10. In the initialization of the memory system 1, a supplier or a user of the memory system 1 may set a row hammer monitor time frame tREFi or tREFw, and may set a threshold as a criterion for determining a row hammer.

In operation S1010, the memory controller 20 may reset the number of accesses to each word line WL1 to WLm of the data chips 110 to 117 to "0". The memory controller 20 may store the number of times of access of each word line WL1 to WLm of the data chips 110 to 117 as "0" in the counter memory cells C110 to C117 of the row hammer counter chip 131.

In operation S1020, the memory controller 20 may monitor a row hammer for a memory cell row of the word lines WL1 to WLm of the data chips 110 to 117. The memory controller 20 may perform a write operation or a read operation performed on the data chips 110 to 117 for each memory process for data exchange with the memory module 10 according to a memory request from the host. At this time, as the memory controller 20 instructs the data chips 110 to 117 to input and output the data set DQ_BL, one of the word lines WL1 to WLm of all the data chips 110 to 117 is may be accessed. During the access operation, a voltage may be applied to the accessed word lines WL1 to WLm, and write data may be written into or read data from the memory cells connected to the accessed word lines WL1 to WLm.

In operation S1030 the memory controller 20 may count a number of times each of the word lines WL1 to WLm of all the data chips 110 to 117 are accessed. The memory controller 20 may calculate the access counts of the word lines WL1 to WLm accessed of all the data chips 110 to 117 by using the row hammer counter 21.

In operation S1040, the memory controller 20 may update the number of times of access of the accessed word lines WL1 to WLm of all data chips 110 to 117 for each memory processing to the access count value calculated in operation S1030.

In operation S1050, the memory controller 20 may store the access count values of the accessed word lines WL1 to WLm of each of the data chips 110 to 117 in the counter memory cells C110 to C117 connected to the accessed word lines WL1 to WLm of the row hammer counter chip 131. As the access count values of all the word lines WL1 to WLm of each of the data chips 110 to 117 are stored in the counter memory cells C110 to C117 connected to the corresponding word lines WL1 to WLm of the row hammer counter chip 131, the memory controller 20 may perform a PRHT function. In each of the data chips 110 to 117, when the number of times of access of the word lines WL1 to WLm stored in the row hammer counter chip 131 is equal to or greater than the threshold, a memory cell row physically adjacent to the memory cell row associated with the accessed word line WL1 to WLm may be target-refreshed.

In operation S1060, the memory controller 20 may determine whether the row hammer monitor time frame tREFi or tREFw has elapsed. If the row hammer monitor time frame has not elapsed (NO), the operation flow proceeds to operation S1020, the memory controller 20 may repeatedly monitor access to memory cell rows of the word lines WL1 to WLm of the data chips 110 to 117. When the row hammer monitor time frame elapses (YES), the operation flow proceeds to operation S1010, the memory controller 20 may reset the number of accesses to each word line WL1 to WLm of the data chips 110 to 117 to "0".

The above-described operation flow may be implemented in any of the memory systems described with reference to FIGS. 5 to 9. Although FIG. 10 illustrates an example embodiment, in which, row hammer coverage is provided in relation to the PRHT function of the row hammer counter chip 131, by storing metadata and/or chip-kill error data in the row hammer counter chip 131, the RAS function may be increased. In addition, the memory system may generate an error detection code based on the data set to be provided to each of the plurality of data chips for each memory processing per memory channel, generate an error correction code based on the user data set corresponding to the entire data set, and provide a basic RAS function by storing the error detection/correction code in the error detection/correction code chip.

Figure 11:
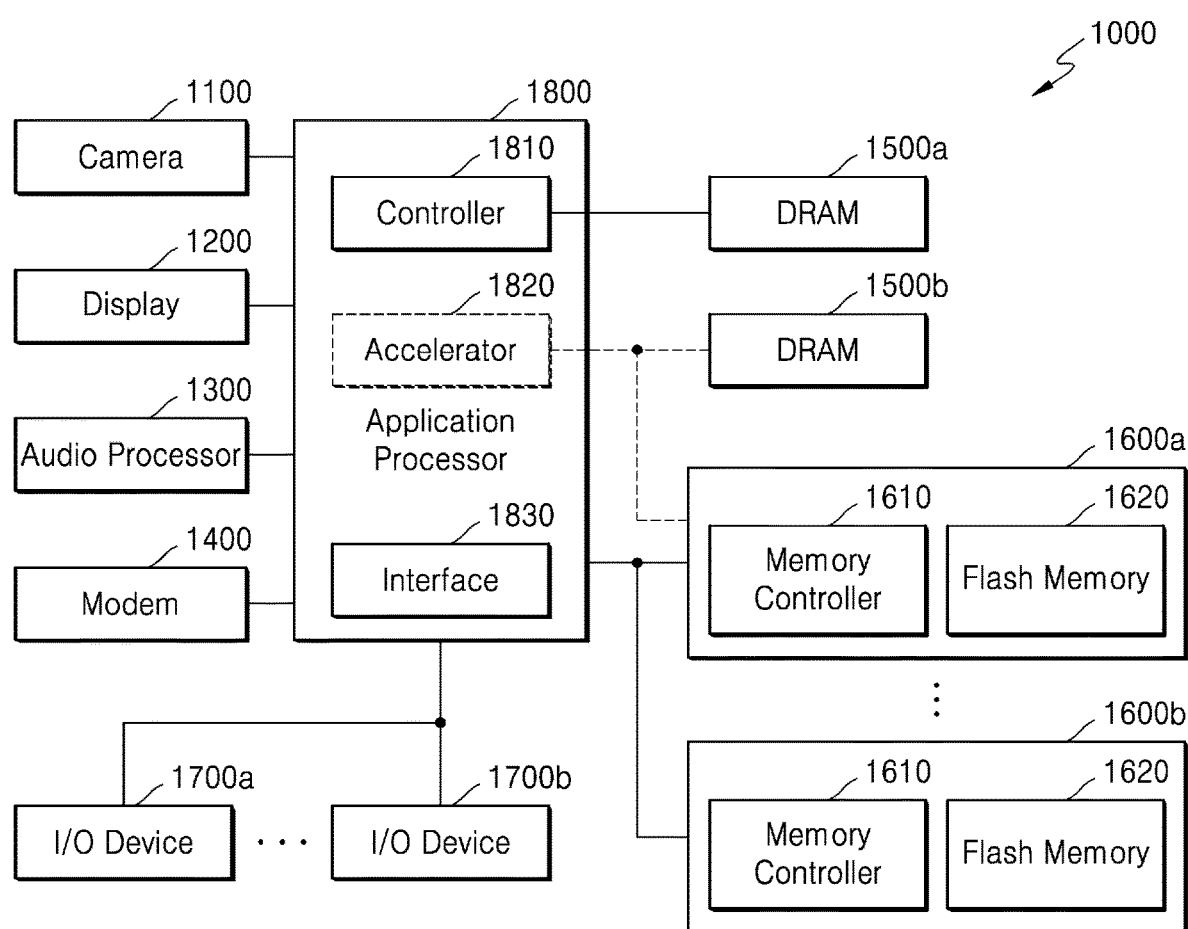
FIG. 11 is a block diagram illustrating a system including a memory module for controlling a row hammer according to embodiments of the disclosure.

FIG. 11 is a block diagram illustrating a system 1000 including a memory module for controlling a row hammer according to embodiments of the disclosure.

Referring to FIG. 11, the system 1000 may include a camera 1100, a display 1200, an audio processor 1300, a modem 1400, DRAMs 1500a and 1500b, flash memories 1600a and 1600b, I/O devices 1700a and 1700b, and an application processor (AP) 1800. The system 1000 may be implemented as a laptop computer, a mobile phone, a smartphone, a tablet personal computer, a wearable device, a healthcare device, or an Internet of Things (IoT) device. In addition, the system 1000 may be implemented as a server or a personal computer.

The camera 1100 may take a still image or a moving picture according to a user's control, and may store the captured image/video data or transmit the stored captured image/video data to the display 1200. The audio processor 1300 may process audio data included in content of the flash memory devices 1600a and 1600b or a network. The modem 1400 modulates and transmits a signal to transmit/receive wired/wireless data, and may demodulate the modulated signal to restore the original signal at the receiving end. The I/O devices 1700a and 1700b may include devices that provide digital input and/or output functionality such as a Universal Serial Bus (USB) or storage, a digital camera, a Secure Digital (SD) card, a Digital Versatile Disc (DVD), a network adapter, a touch screen, and the like.

The AP 1800 may control the overall operation of the system 1000. The AP 1800 may control the display 1200 so that a part of the content stored in the flash memory devices 1600a and 1600b is displayed on the display 1200. When a user input is received through the I/O devices 1700a and 1700b, the AP 1800 may perform a control operation corresponding to the user input. The AP 1800 may include an accelerator block, which is a dedicated circuit for artificial intelligence (AI) data operation, or may include an accelerator chip 1820 separately from the AP 1800. DRAM 1500b may be additionally mounted to the accelerator block or accelerator chip 1820. The accelerator is a function block that professionally performs a particular function of the AP 1800, and may include a GPU that is a function block that specializes in processing graphic data, a Neural Processing Unit (NPU) that is a block for professionally performing AI calculations and inference, and a Data Processing Unit (DPU) that is a block for specializing in data transfer.

The system 1000 may include the plurality of DRAMs 1500a and 1500b. The AP 1800 may control the DRAMs 1500a and 1500b through the command and mode register (MRS) setting that meets the Joint Electron Device Engineering Council (JEDEC) standard, and communicate by setting the DRAM interface protocol to use company-particular functions such as low voltage/high speed/reliability and Cyclic Redundancy Check (CRC)/Error Correction Code (ECC) functions. For example, the AP 1800 may communicate with the DRAM 1500a through an interface conforming to JEDEC standards, such as LPDDR4 and LPDDR5, and the accelerator block or accelerator chip 1820 may communicate by setting a new DRAM interface protocol to control the accelerator DRAM 1500b having a higher bandwidth than the DRAM 1500a.

Although only the DRAMs 1500a and 1500b are illustrated in FIG. 11, the disclosure is not limited thereto, and if the AP 1800 or accelerator chip 1820 bandwidth, reaction speed, and voltage conditions are satisfied, any memory, such as PRAM, SRAM, MRAM, RRAM, FRAM, or Hybrid RAM, may be used. The DRAMs 1500a and 1500b have relatively smaller latency and bandwidth than the I/O devices 1700a and 1700b or the flash memories 1600a and 1600b. The DRAMs 1500a and 1500b may be initialized at the power-on time point of system 1000, and may be used as a temporary storage location for the operating system and application data loaded with the operating system and application data, or may be used as an execution space for various software codes.

In the DRAMs 1500a and 1500b, addition/subtraction/multiplication/division operations, vector operations, address operations, or Fast Fourier Transform (FFT) operations may be performed. In addition, a function used for inference may be performed in the DRAMs 1500a and 1500b. Here, the inference may be performed in a deep learning algorithm using an artificial neural network. The deep learning algorithm may include a training operation of learning a model through various data and an inference operation of recognizing data with the learned model. As an example embodiment, the image captured by the user through the camera 1100 is signal-processed and stored in the DRAM 1500b, and the accelerator block or accelerator chip 1820 may perform AI data operation for recognizing data using data stored in the DRAM 1500b and a function used for inference.

The system 1000 may include a plurality of storage or a plurality of flash memories 1600a and 1600b having a larger capacity than the DRAMs 1500a and 1500b. The accelerator block or accelerator chip 1820 may perform a training operation and AI data operation by using the flash memory devices 1600a and 1600b. In an example embodiment, the flash memories 1600a and 1600b may more efficiently perform a training operation and an inference AI data operation performed by the AP 1800 and/or the accelerator chip 1820 using the arithmetic device provided in the memory controller 1610. The flash memories 1600a and 1600b may store pictures taken through the camera 1100 or data transmitted through a data network. For example, augmented reality/virtual reality, High Definition (HD), or Ultra High Definition (UHD) content may be stored.

In the system 1000, the DRAMs 1500a and 1500b may employ a memory module including a plurality of data chips and a row hammer counter chip described with reference to FIGS. 1 to 10. The DRAMs 1500a and 1500b may store an access count value of an accessed word line of each data chip in counter memory cells connected to an accessed word line of the row hammer counter chip during a row hammer monitor time frame. In addition, the row hammer counter chip may store metadata related to data stored in each of the plurality of data chips and/or chipkill error data for inactivating a nonfunctional data chip among the plurality of data chips. In each of the data chips, when the number of accesses to the word line stored in the row hammer counter chip exceeds the threshold, the information on the accessed word line is provided to the memory controller that controls the refresh operation of the DRAMs 1500a and 1500b, or a memory cell row physically adjacent to the memory cell row associated with the accessed word line may be target-refreshed. In addition, the DRAMs 1500a and 1500b may generate an error detection code based on a data set to be provided to each of a plurality of data chips for each memory processing per memory channel, generate an error correction code based on the user data set corresponding to the entire data set, and store the error detection/correction code in the error detection/correction code chip. Accordingly, the DRAMs 1500a and 1500b may provide an increased RAS function by providing row hammer coverage, metadata, and/or chipkill coverage in addition to the RAS function providing an error detection code and an error correction code.

While the disclosure has been particularly shown and described with reference to embodiments thereof, it will be understood that various changes in form and details may be made therein without departing from the spirit and scope of the following claims.

What is claimed is:

1. A memory module comprising:
   a plurality of data chips each of which is configured to store a data set corresponding to a plurality of burst lengths; and
   at least one row hammer counter chip comprising a plurality of counter memory cells, each of the plurality of counter memory cells connected to a word line, among a plurality of word lines, for each of the plurality of data chips,
   wherein the at least one row hammer counter chip is configured to independently store in each of the plurality of counter memory cells connected to the word line, a number of times the word line is accessed for each of the plurality of data chips during a row hammer monitoring time frame,
   wherein the plurality of counter memory cells comprises:
      a plurality of first word line cells connected to a first word line, among the plurality of word lines, and
      a plurality of second word line cells connected to a second word line, among the plurality of word lines, and
   wherein the plurality of first word line cells comprises:
      a plurality of first data chip cells dedicated for storing a number of times a first word line of a first data chip, among the plurality of data chips, is accessed, and
      a plurality of second data chip cells dedicated for storing a number of times a first word line of a second data chip, among the plurality of data chips, is accessed.

2. The memory module of claim 1, wherein, based on the number of times of access to the word line stored in the at least one row hammer counter chip exceeding a threshold value, each of the plurality of data chips is configured to refresh a first memory cell row physically adjacent to a second memory cell row associated with the word line.

3. The memory module of claim 1, wherein, based on the number of times of access to the word line stored in the at least one row hammer counter chip exceeding a threshold value, each of the plurality of data chips is configured to provide information on the word line to a memory controller that controls a refresh operation of the memory module.

4. The memory module of claim 1, wherein the row hammer monitoring time frame is set to a refresh window time tREFw or a basic refresh rate time tREFi of the plurality of data chips.

5. The memory module of claim 1, wherein, after the row hammer monitoring time frame has elapsed, the at least one row hammer counter chip is configured to reset a number of times of access of each of the plurality of word lines of each of the plurality of data chips.

6. The memory module of claim 1, wherein the at least one row hammer counter chip is further configured to store metadata related to data stored in each of the plurality of data chips,
   wherein the metadata comprises vendor metadata related to validity, identification parameters, compression information, file properties, security, access control information, or information about the memory module related to the data.

7. The memory module of claim 1, wherein the at least one row hammer counter chip is further configured to store chipkill error data for inactivating a nonfunctional data chip among the plurality of data chips.

8. The memory module of claim 1, wherein the plurality of data chips comprise two memory channel groups, and
   wherein a data set is input into or output from data memory cells connected to the word line for each of the plurality of data chips belonging to an individual memory channel group per memory transaction for data exchange with a memory controller.

9. The memory module of claim 8, further comprising an error detection code chip configured to store an error detection code generated based on the data set provided to each of the plurality of data chips.

10. The memory module of claim 8, wherein the data set comprises 64 data bits.

11. The memory module of claim 8, further comprising an error correction code chip configured to store an error correction code generated based on a user data set corresponding to an entirety of the data set provided to each of the plurality of data chips.

12. The memory module of claim 11, wherein the user data set comprises 512 bits.

13. The memory module of claim 1, wherein the plurality of burst lengths are 16.

14. The memory module of claim 1, wherein the memory module is a double data rate synchronous dynamic random-access memory dual in-line memory module (DDR DIMM).

15. A memory system comprising:
   a memory module comprising a plurality of data chips and at least one row hammer counter chip, each of the plurality of data chips configured to store a data set corresponding to a plurality of burst lengths, and the at least one row hammer counter chip comprising a plurality of counter memory cells, each of the plurality of counter memory cells connected to a word line, among a plurality of word lines of the plurality of data chips; and
   a memory controller configured to count a number of times the word line, among the plurality of word lines, of each of the plurality of data chips is accessed during a row hammer monitoring time frame,
   wherein the at least one row hammer counter chip is configured to independently store in each of the plurality of counter memory cells connected to the word line, the number of times the word line is accessed for each of the plurality of data chips,
   wherein the plurality of counter memory cells comprises:

a plurality of first word line cells connected to a first word line, among the plurality of word lines, and a plurality of second word line cells connected to a second word line, among the plurality of word lines, and wherein the plurality of first word line cells comprises:
- a plurality of first data chip cells dedicated for storing a number of times a first word line of a first data chip, among the plurality of data chips, is accessed, and
- a plurality of second data chip cells dedicated for storing a number of times a first word line of a second data chip, among the plurality of data chips, is accessed.

16. The memory system of claim 15, wherein, based on the number of times of access to the word line stored in the at least one row hammer counter chip exceeding a threshold value, each of the plurality of data chips is configured to refresh a first memory cell row physically adjacent to a second memory cell row associated with the word line.

17. The memory system of claim 15, wherein, based on the number of times of access to the word line stored in the at least one row hammer counter chip exceeding a threshold value, each of the plurality of data chips is configured to provide information on the word line to the memory controller.

18. A method of operating a memory system comprising a memory module and a memory controller for controlling the memory module, wherein the memory module comprises a plurality of data chips and a row hammer counter chip comprising a plurality of counter memory cells, each of the plurality of counter memory cells connected to one of a plurality of word lines of the plurality of data chips, the method comprising:
- counting, by the memory controller, a number of times a word line, among the plurality of word lines, of each of the plurality of data chips is accessed during a row hammer monitoring time frame; and
- independently storing, by the memory controller, in each of the plurality of counter memory cells connected to the word line, the number of times the word line is accessed for each of the plurality of data chips, wherein the plurality of counter memory cells comprises:
- a plurality of first word line cells connected to a first word line, among the plurality of word lines, and
- a plurality of second word line cells connected to a second word line, among the plurality of word lines, and wherein the independently storing the number of times the word line is accessed for each of the plurality of data chips comprises:
- storing in a plurality of dedicated first data chip cells, among the plurality of first word line cells, a number of times a first word line of a first data chip, among the plurality of data chips, is accessed, and
- storing in a plurality of dedicated second data chip cells, among the plurality of first word line cells, a number of times a first word line of a second data chip, among the plurality of data chips, is accessed.

19. The method of claim 18, wherein the storing the number of times the word line is accessed for each of the plurality of data chips comprises storing a number of times of access to all word lines of the plurality of data chips, and wherein word lines of the row hammer counter chip are commonly connected to corresponding word lines of the plurality of data chips.

20. The method of claim 18, further comprising resetting the number of times of access to each of the plurality of word lines of each of the plurality of data chips after the row hammer monitoring time frame has elapsed.

21. The memory module of claim 1, wherein the at least one row hammer counter chip comprises a first bank comprising a first memory cell group and a second memory cell group.

22. The memory module of claim 21, wherein the first memory cell group comprises a plurality of first memory cells including the plurality of first word line cells and the plurality of second word line cells, and the first memory cell group comprises a plurality of second memory cells configured to store one of metadata or chipkill error data.

* * * * *